US011742172B2

United States Patent
Dobashi et al.

(10) Patent No.: US 11,742,172 B2
(45) Date of Patent: Aug. 29, 2023

(54) CHARGED PARTICLE BEAM DEVICE AND CONTROL METHOD THEREOF

(71) Applicant: Hitachi High-Tech Corporation, Tokyo (JP)

(72) Inventors: Takashi Dobashi, Tokyo (JP); Hirokazu Tamaki, Tokyo (JP); Hiromi Mise, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 153 days.

(21) Appl. No.: 17/421,147

(22) PCT Filed: Jan. 11, 2019

(86) PCT No.: PCT/JP2019/000643
§ 371 (c)(1),
(2) Date: Jul. 7, 2021

(87) PCT Pub. No.: WO2020/144838
PCT Pub. Date: Jul. 16, 2020

(65) Prior Publication Data
US 2022/0059313 A1    Feb. 24, 2022

(51) Int. Cl.
*H01J 37/20*    (2006.01)
*G06T 7/73*    (2017.01)
(Continued)

(52) U.S. Cl.
CPC .............. *H01J 37/20* (2013.01); *G01N 23/04* (2013.01); *G01N 23/06* (2013.01); *G06T 7/74* (2017.01);
(Continued)

(58) Field of Classification Search
CPC .......... H01J 37/20; H01J 37/222; H01J 37/26; H01J 2237/20207; H01J 37/265;
(Continued)

(56) References Cited

U.S. PATENT DOCUMENTS 6,492,644 B1 * 12/2002 Staib .................. H01J 37/252
250/305
9,978,557 B2 * 5/2018 Flanagan, IV ........ H01J 37/261
(Continued)

FOREIGN PATENT DOCUMENTS

JP    H11-233062 A    8/1999
JP    2001-124713 A    5/2001
(Continued)

OTHER PUBLICATIONS

Search Report dated Feb. 19, 20219 in International Application No. PCT/JP2019/000643.
(Continued)

*Primary Examiner* — David A Vanore
(74) *Attorney, Agent, or Firm* — Miles & Stockbridge, P.C.

(57) ABSTRACT

A charged particle beam device includes: a movement mechanism configured to hold and move a sample; a charged particle source configured to emit charged particles with which the sample is irradiated to obtain an image of the sample; and a control unit configured to control the movement mechanism to move the sample and to obtain the image of the sample. The control unit obtains a reference image of the sample in a reference arrangement state by the charged particles, generates a goal image of the sample in a target arrangement state different from the reference arrangement state by calculation from the reference image, moves the sample to each of different arrangement states by the movement mechanism, obtains a candidate image of the sample in each of the different arrangement states by the charged particles, and generates a comparison result between respective candidate images and the goal image.

15 Claims, 11 Drawing Sheets

(51) Int. Cl.
  *G01N 23/04* (2018.01)
  *G01N 23/06* (2018.01)
  *H01J 37/22* (2006.01)
  *H01J 37/26* (2006.01)
(52) U.S. Cl.
  CPC ............ *H01J 37/222* (2013.01); *H01J 37/26* (2013.01); *G01N 2223/04* (2013.01); *G01N 2223/10* (2013.01); *G01N 2223/3306* (2013.01); *G01N 2223/418* (2013.01); *G06T 2207/10061* (2013.01); *H01J 2237/20207* (2013.01)
(58) Field of Classification Search
  CPC .... G01N 23/04; G01N 23/06; G01N 2223/04; G01N 2223/10; G01N 2223/3306; G01N 2223/418; G06T 7/74; G06T 2207/10061
  See application file for complete search history.

(56) References Cited

U.S. PATENT DOCUMENTS

| | | | | |
|---|---|---|---|---|
| 11,177,108 | B2* | 11/2021 | Shirasaki | H01J 37/1475 |
| 11,268,915 | B2* | 3/2022 | Nomaguchi | H01J 37/3023 |
| 11,321,585 | B2* | 5/2022 | Maeda | G06T 7/60 |
| 11,380,514 | B2* | 7/2022 | Tamaki | H01J 37/153 |
| 11,519,871 | B2* | 12/2022 | Klusáček | H01J 37/28 |
| 2007/0075259 | A1 | 4/2007 | Fujita | |
| 2009/0127474 | A1* | 5/2009 | Tsuneta | H01J 37/20 250/311 |
| 2015/0060695 | A1* | 3/2015 | Man | H01J 37/252 250/442.11 |
| 2017/0133195 | A1* | 5/2017 | Yaguchi | H01J 37/20 |
| 2018/0005797 | A1 | 1/2018 | Kato et al. | |
| 2021/0033548 | A1* | 2/2021 | Tuma | H01J 37/244 |
| 2022/0344124 | A1* | 10/2022 | Chiba | G06V 20/52 |

FOREIGN PATENT DOCUMENTS

| | | |
|---|---|---|
| JP | 2003-187730 A | 7/2003 |
| JP | 2009110734 A | 5/2009 |
| JP | 2010212067 A | 9/2010 |
| JP | 2014170751 A | 9/2014 |
| WO | 2016006375 A1 | 1/2016 |

OTHER PUBLICATIONS

Written Opinion dated Feb. 19, 20219 in International Application No. PCT/JP2019/000643.
Search Report dated Jun. 26, 2018 in International Application No. PCT/JP2018/013901.
Written Opinion dated Jun. 26, 2018 in International Application No. PCT/JP2018/013901.
Notice of Allowance dated Jul. 19, 2021 in U.S. Appl. No. 16/979,952.

* cited by examiner

[FIG. 1A]
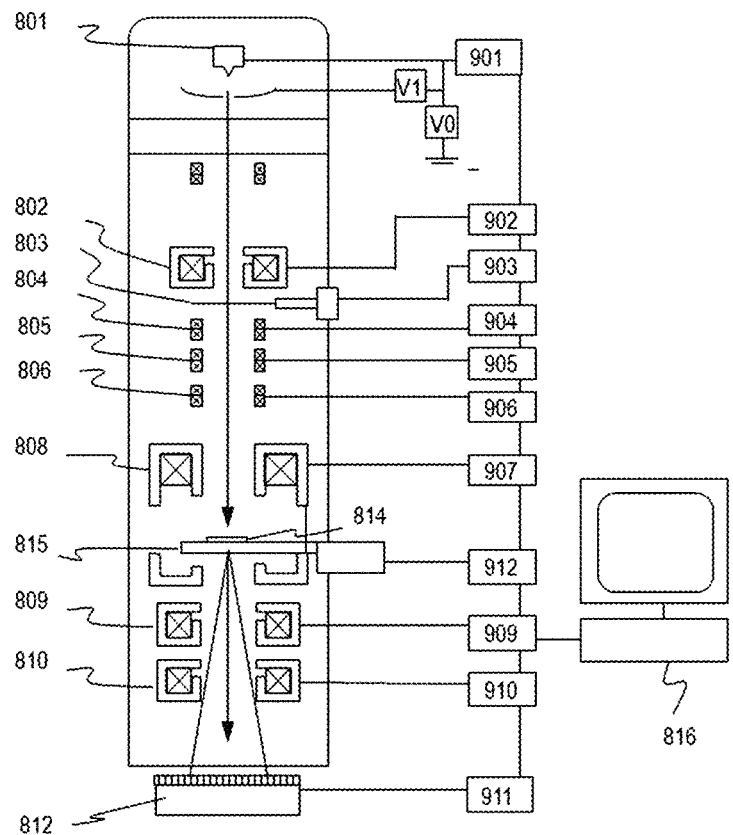
[FIG. 1B]
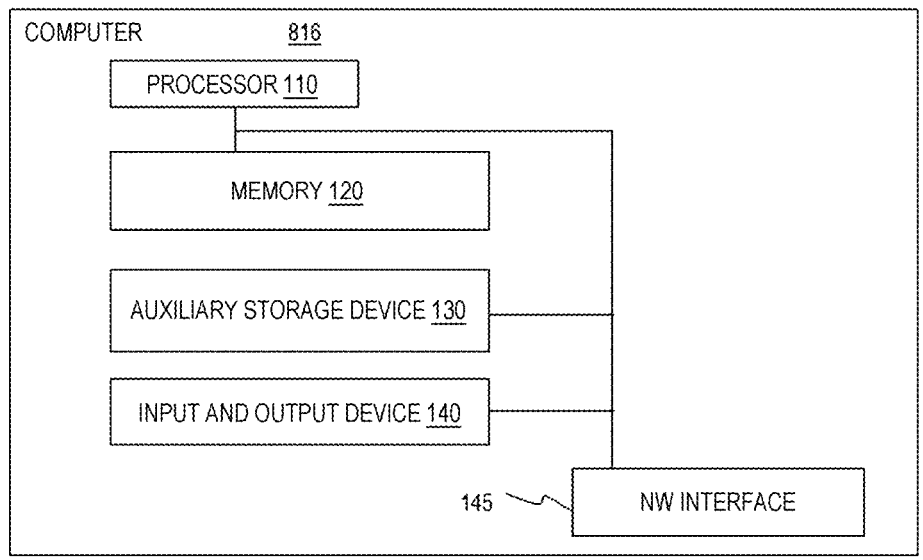

[FIG. 2]
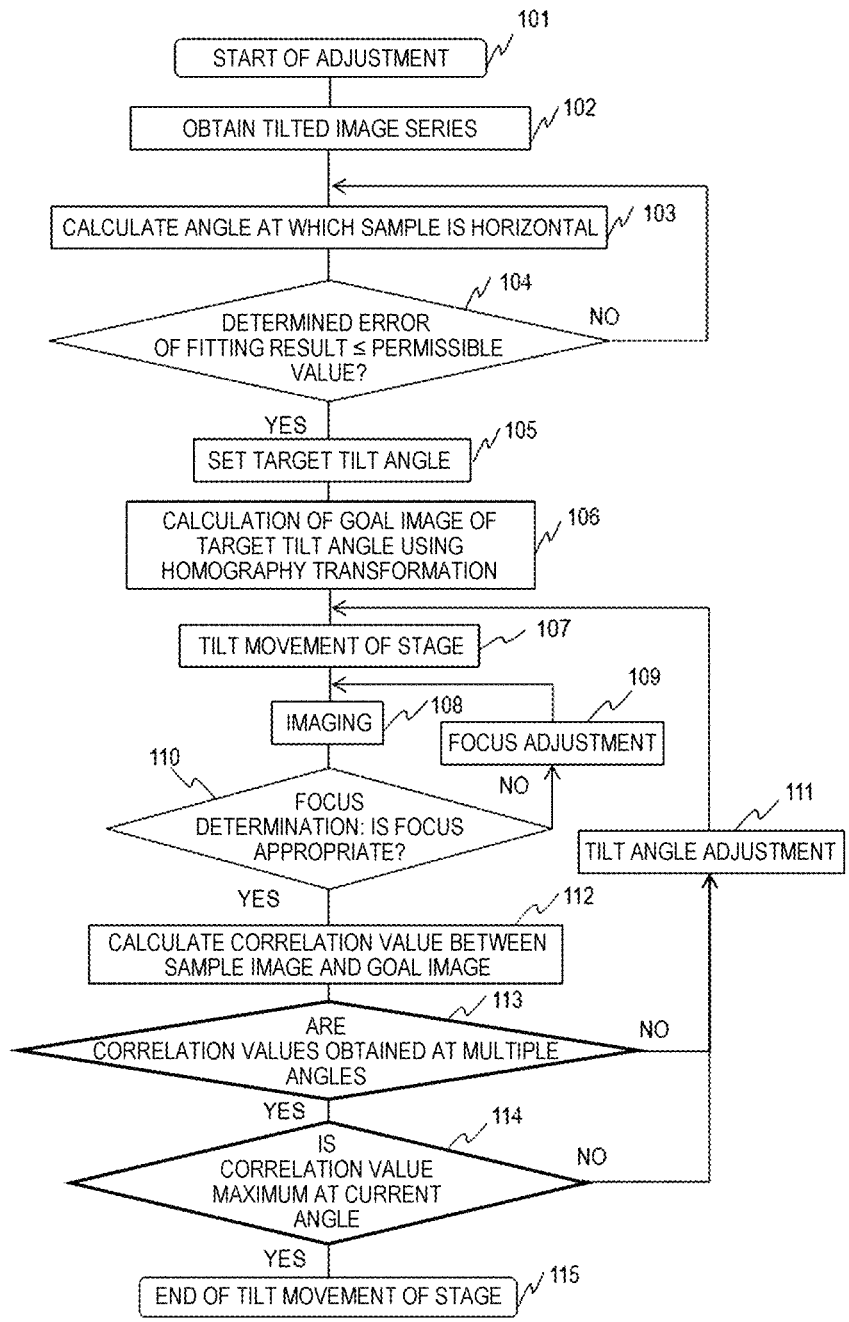

[FIG. 3]
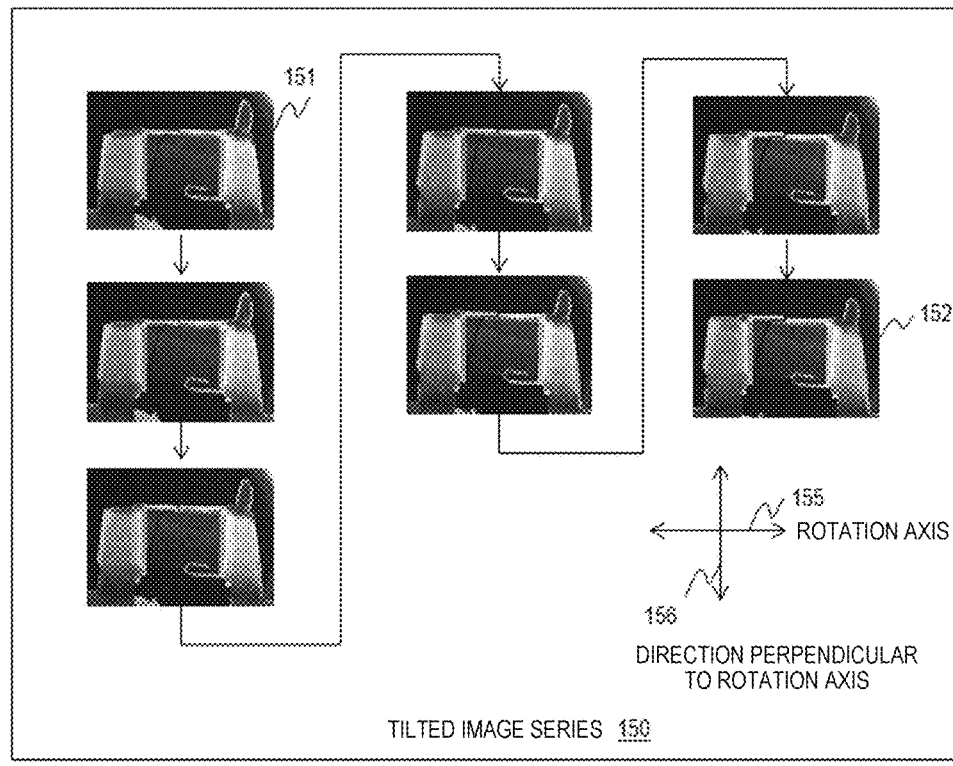
[FIG. 4]
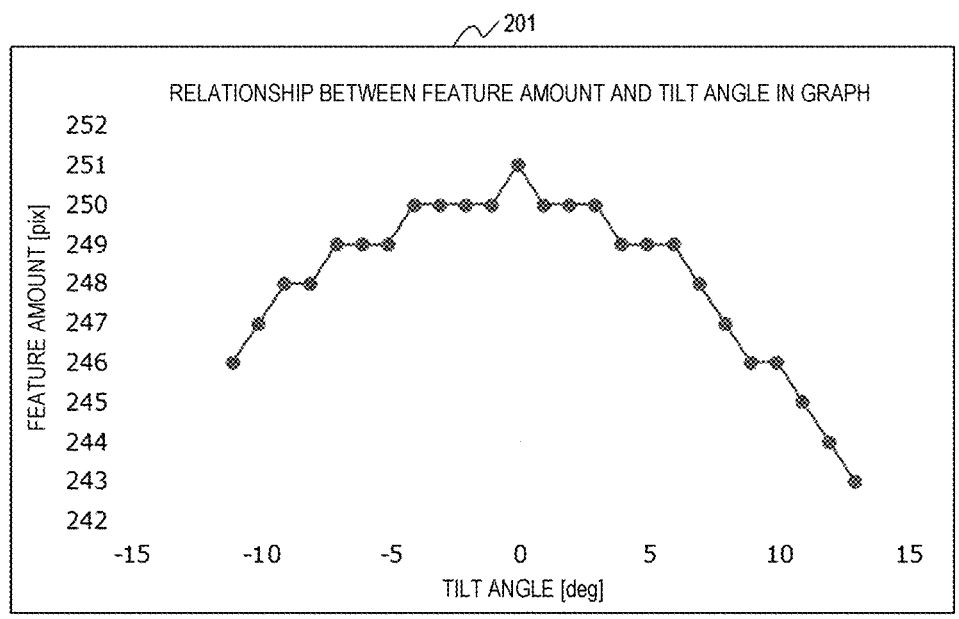

[FIG. 5]
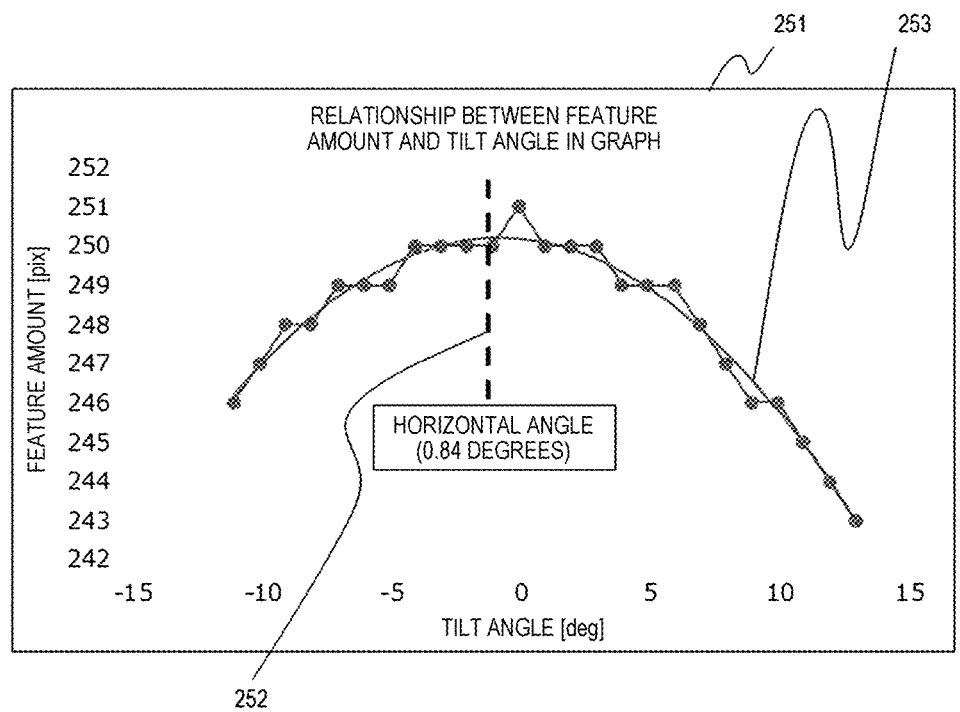
[FIG. 6]
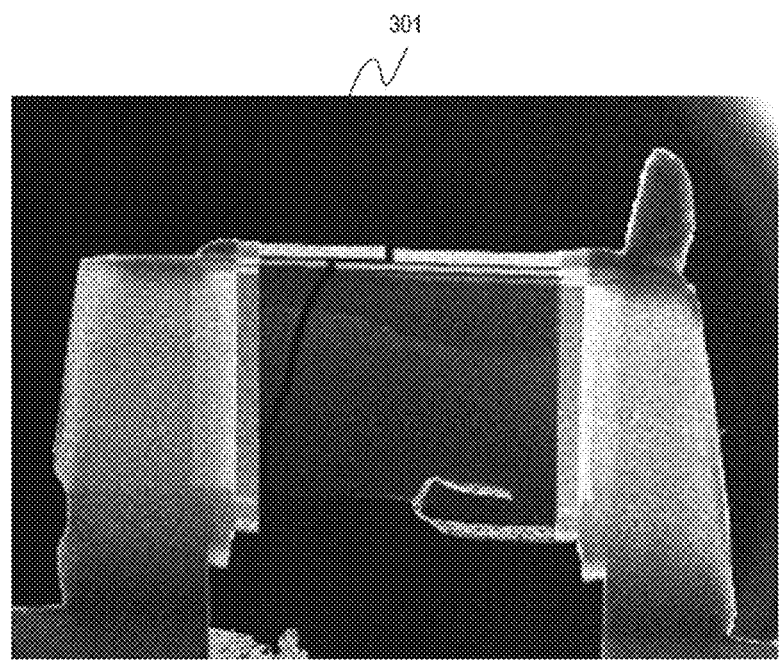
GOAL IMAGE

[FIG. 7]
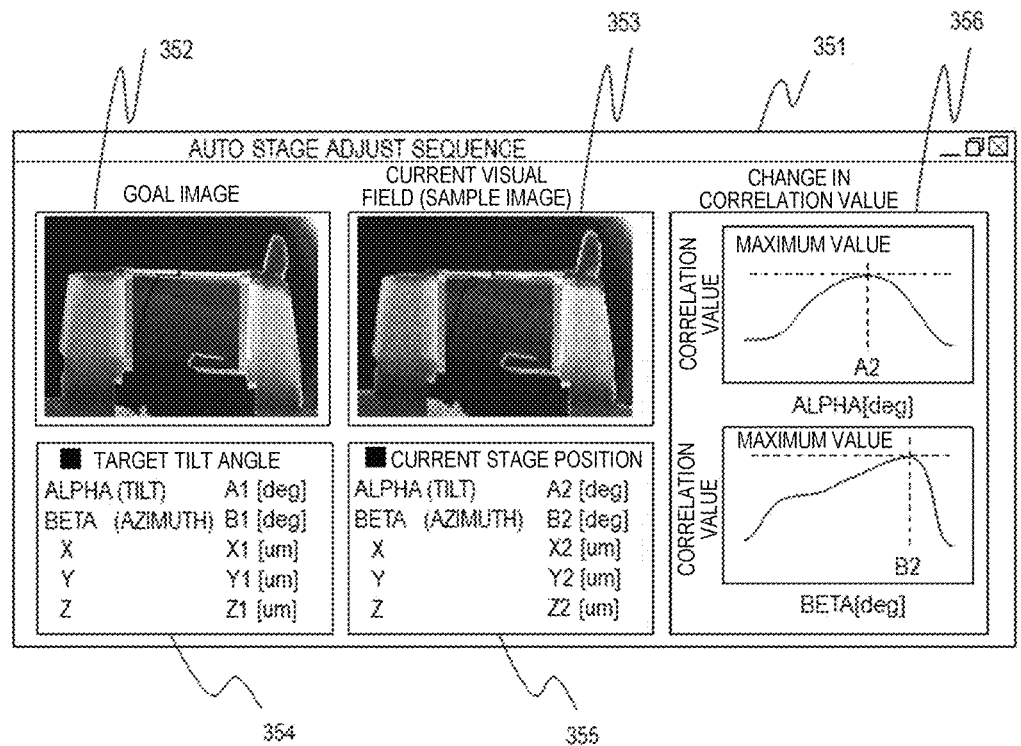
[FIG. 8]
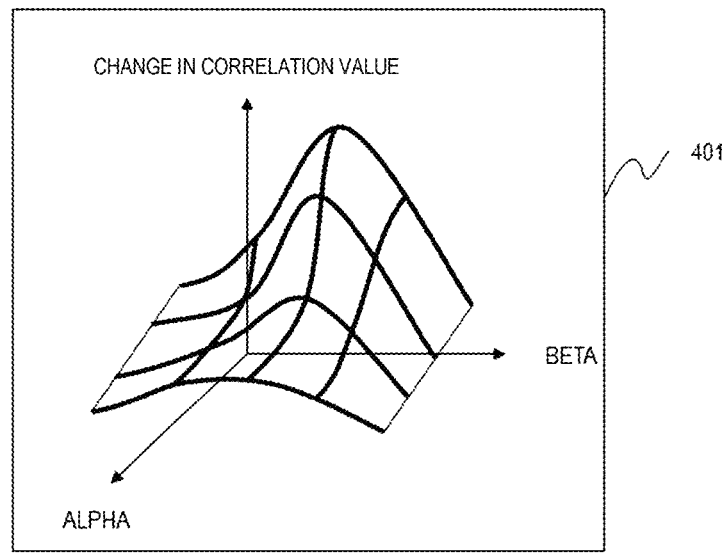

[FIG. 9]
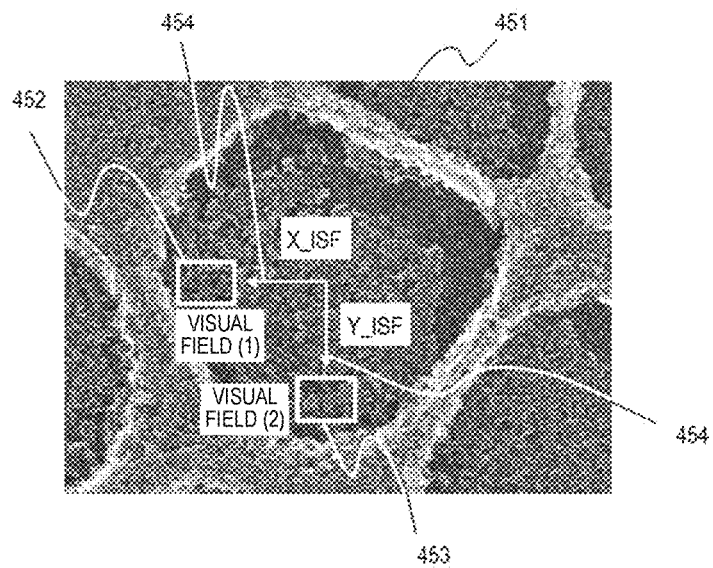
[FIG. 10]
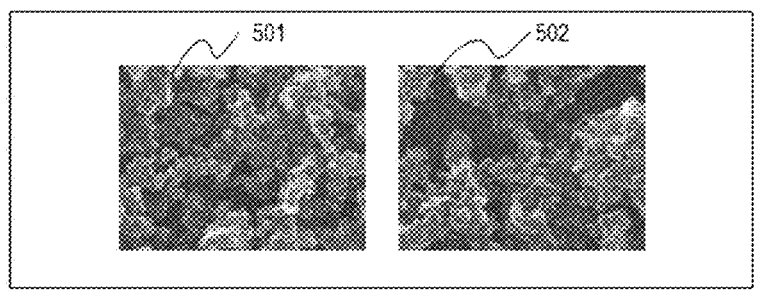

[FIG. 11A]
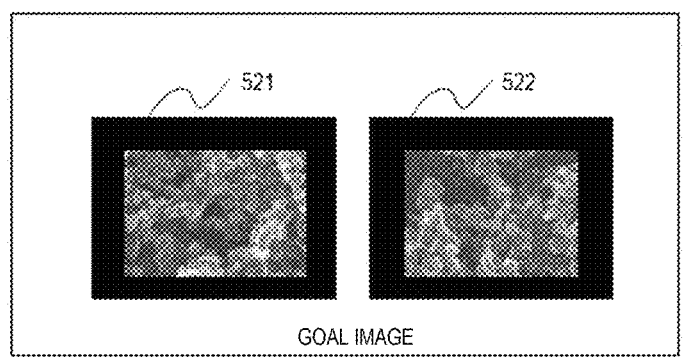
GOAL IMAGE
[FIG. 11B]
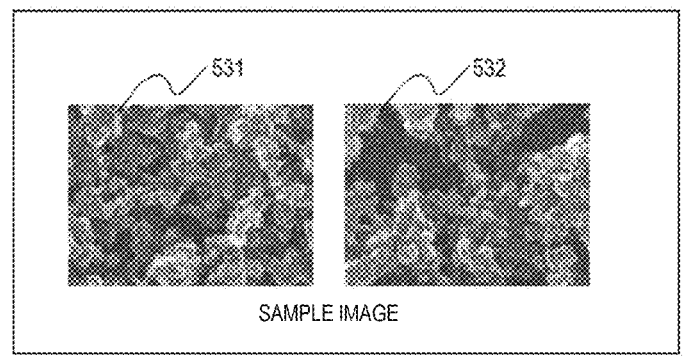
SAMPLE IMAGE

[FIG. 12]
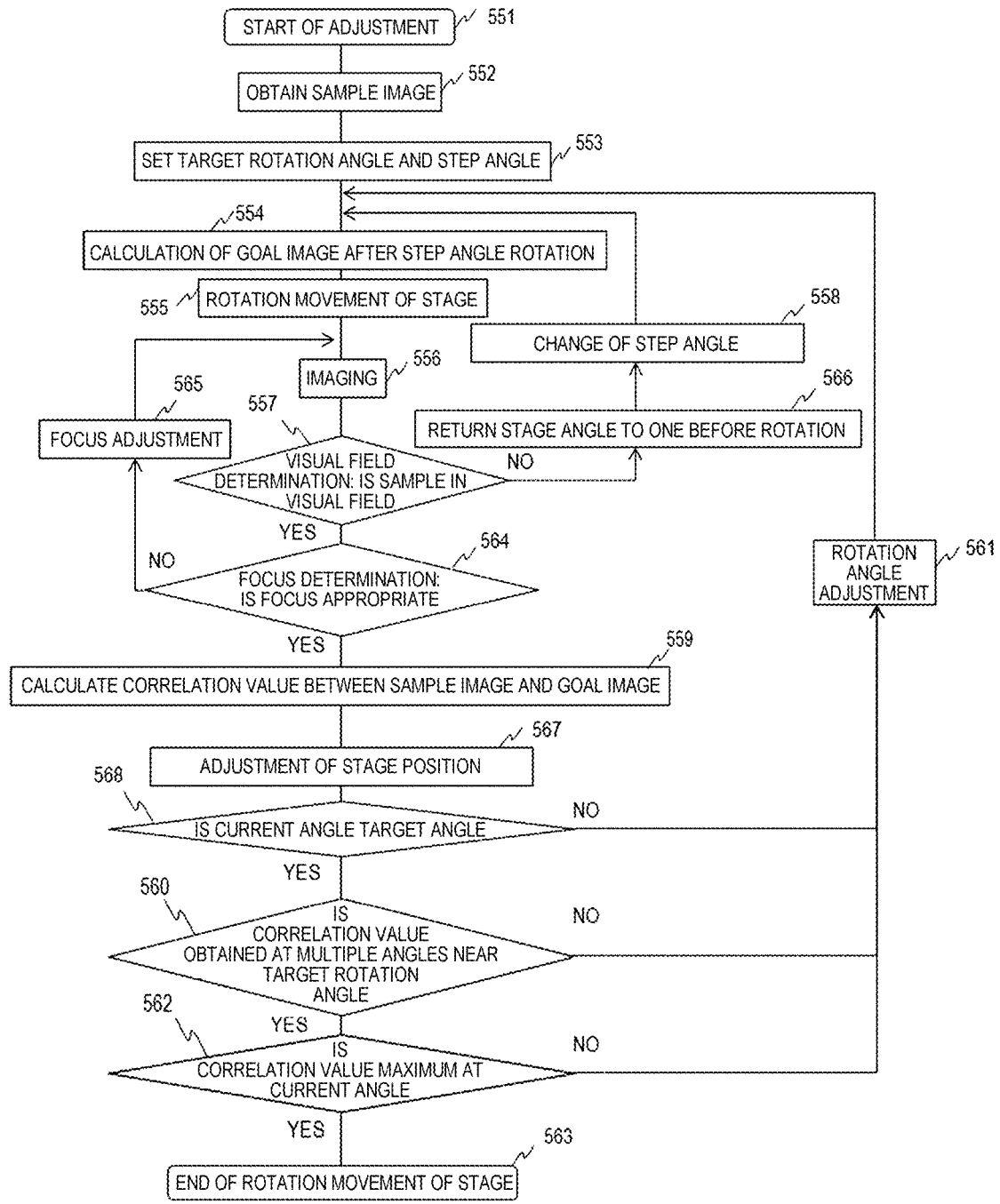

[FIG. 13]
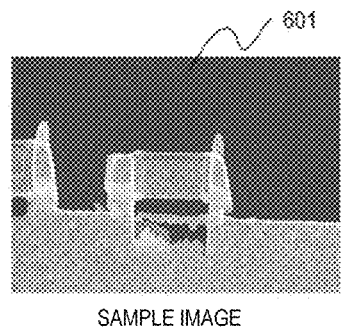
SAMPLE IMAGE
[FIG. 14]
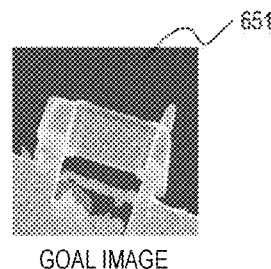
GOAL IMAGE
[FIG. 15]
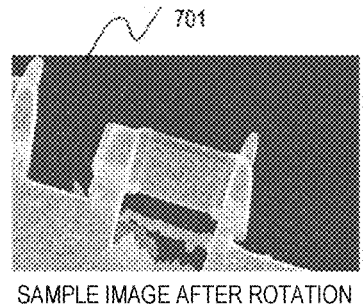
SAMPLE IMAGE AFTER ROTATION

[FIG. 16]
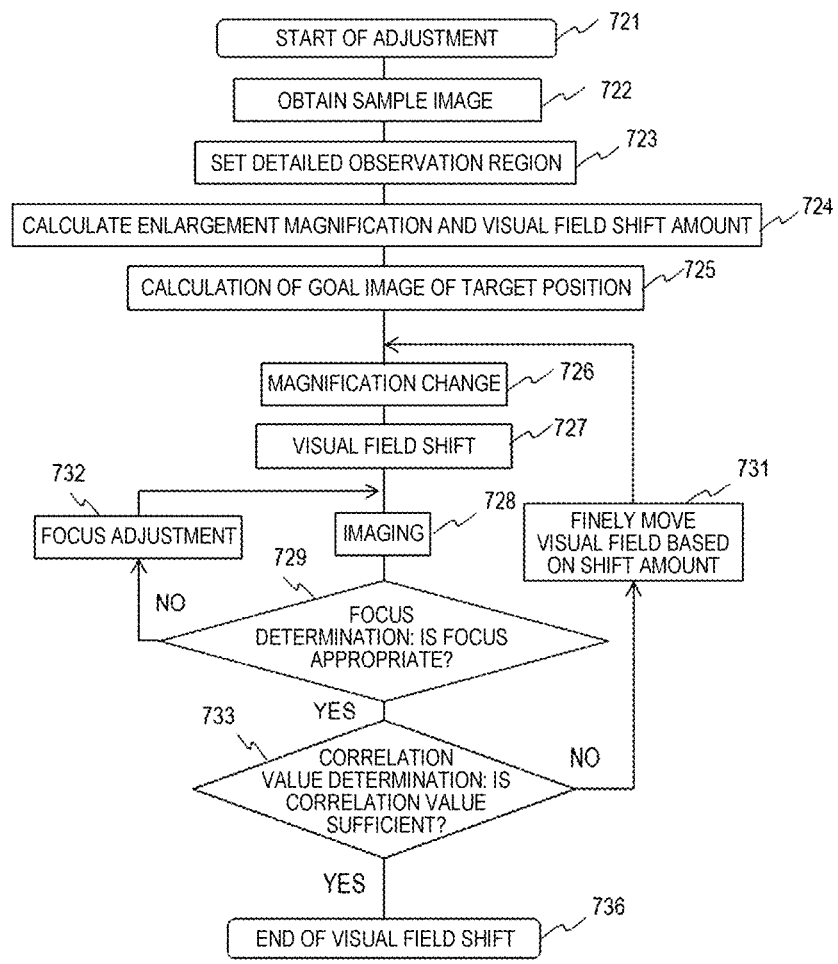

[FIG. 17]
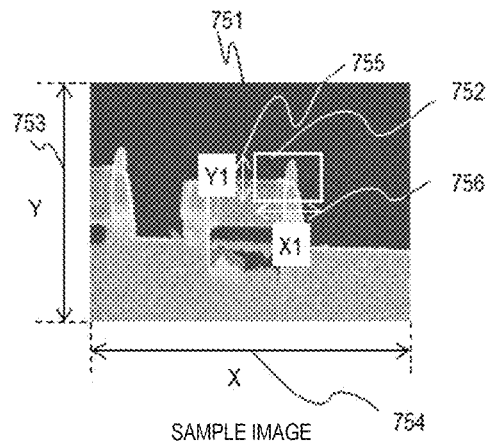
SAMPLE IMAGE
[FIG. 18]
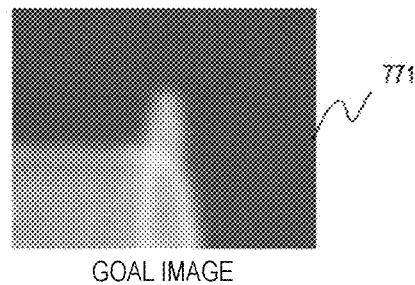
GOAL IMAGE
[FIG. 19]
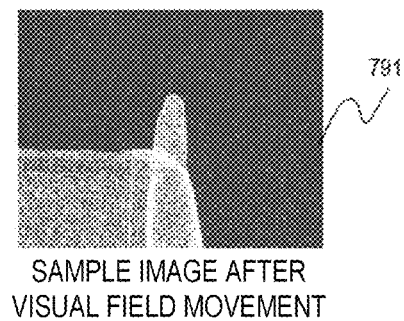
SAMPLE IMAGE AFTER
VISUAL FIELD MOVEMENT

CHARGED PARTICLE BEAM DEVICE AND CONTROL METHOD THEREOF

TECHNICAL FIELD

The present invention relates to a charged particle beam device and a control method thereof.

BACKGROUND ART

In STEM and TEM observation, a resolution of an obtained image changes depending on an orientation of a sample irradiated with an electron beam. By disposing a sample structure in a traveling direction of the electron beam to be emitted, a high-resolution image in which image bleeding is prevented can be obtained by electron microscopy observation. Depending on the observed sample, the orientation of the sample may be known from an appearance of the sample, but in a case of a sample prepared by a focused ion beam device or the like, the appearance and a crystal direction inside are different, and the orientation of the sample cannot be known as it is. When the sample orientation cannot be determined from the appearance, an amount of deviation and a direction of the sample orientation are calculated using a diffraction pattern obtained by emitting the electron beam.

As a method for determining the orientation of the sample from the diffraction pattern, PTL 1 discloses a method in which circle fitting is performed on the diffraction pattern and the sample is tilted from a center of a circle toward a direction of a spot called the 0th order having strong intensity. In PTL 2, diffraction patterns are obtained for a plurality of angles, and each diffraction pattern is approximated by a circle. A method is disclosed in which the angle at which a radius of the approximate circle is the smallest is set as an optimum sample orientation. PTL 3 discloses a method in which samples are tilted in a direction in which a diffraction pattern is isotropic by using a fact that an intensity distribution of a diffraction pattern spreads isotropically when orientations of the samples match. PTL 4 discloses a method of identifying an orientation of a sample by using a diffraction pattern of a sample prepared at a plurality of tilt angles as a reference image and comparing the diffraction pattern with a current diffraction pattern.

PTLs 1 to 4 disclose a method of calculating the sample orientation from the diffraction pattern, but in the sample tilt, it is necessary not only to calculate the sample orientation but also to move a sample stage to the calculated orientation. Generally, target sample tilt accuracy is about 0.2 degrees, although the accuracy depends on the required sample resolution (resolution). Since the sample stage has backlash and visual field escape, it is not easy to adjust the orientation of the sample with this accuracy by using the tilt of the stage. Normally, after adjusting the tilt angle by the stage, the diffraction pattern is obtained again and the sample orientation is confirmed a plurality of times. In this work, the visual field escapes each time a tilt direction of the sample is changed, and therefore, observation magnification of the electron microscopy is decreased, and the work of confirming and correcting the visual field escape using a sample image of low magnification is repeated.

In PTL 2, as a method of automatically trying such a time-consuming adjustment work a plurality of times, a method of adjusting, by recording a movement amount due to the tilt of the stage in advance and creating a table, the orientation without looking at the sample image while correcting the visual field escape when the sample is tilted is disclosed. However, the visual field escape is not only correctable by an open-loop method of creating a table of stage movement amount in advance, but also has poor reproducibility as disclosed in PTL 5, and therefore, it is difficult to avoid visual field escape by this method alone.

PTL 5 discloses a method of observing the sample image during sample tilt, recording a movement amount, and feeding the movement amount back to the stage in order to correct the visual field escape having poor reproducibility due to the sample tilt. However, in PTL 5, the sample tilt direction is basically constant because three-dimensional observation is performed, an effect of backlash of the stage is small, and it can be said that it is insufficient as a method of deriving the sample orientation of the observed sample with high accuracy while confirming the sample tilt using the diffraction pattern.

CITATION LIST

Patent Literature

PTL 1: WO 2016/006375
PTL 2: JP-A-2010-212067
PTL 3: JP-A-2014-170751
PTL 4: U.S. Pat. No. 9,978,557
PTL 5: JP-A-2009-110734

SUMMARY OF INVENTION

Technical Problem

According to PTL 5, the backlash when adjusting the sample orientation is close to 1 degree at the maximum. Further, under conditions we investigated, an amount of visual field escape is 10 µm or more in the largest case. In an electron microscopy for observing sub-nm, adjusting while confirming a diffraction pattern and a sample position a plurality of times under such conditions is a great loss in time.

Solution to Problem

A charged particle beam device according to one aspect of the invention includes: a movement mechanism configured to hold and move a sample; a charged particle source configured to emit charged particles with which the sample is irradiated to obtain an image of the sample; and a control unit configured to control the movement mechanism to move the sample and to obtain the image of the sample. The control unit obtains a reference image of the sample in a reference arrangement state by the charged particles, generates a goal image of the sample in a target arrangement state different from the reference arrangement state by calculation from the reference image, moves the sample to each of a plurality of different arrangement states by the movement mechanism, obtains a candidate image of the sample in each of the plurality of different arrangement states by the charged particles, and generates a comparison result between respective candidate images and the goal image.

Advantageous Effect

One aspect of the invention can implement highly accurate sample movement in a charged particle beam device.

BRIEF DESCRIPTION OF DRAWINGS

FIG. 1A is an illustration diagram showing a transmission electron microscopy.

FIG. 1B is an illustration diagram of a computer.

FIG. 2 is a flow chart for solving a problem of stage tilt.

FIG. 3 shows an example of a tilted image series.

FIG. 4 shows an extraction result of a feature amount.

FIG. 5 shows a result of fitting to the feature amount.

FIG. 6 shows an example of a goal image.

FIG. 7 shows a GUI displayed on a computer screen.

FIG. 8 shows a display example in which a change in a correlation value is displayed in three dimensions.

FIG. 9 shows a low-magnification sample image.

FIG. 10 shows a sample image observed by enlarging a close-up region.

FIG. 11A shows an example of a goal image.

FIG. 11B shows an example of a sample image after tilt movement.

FIG. 12 is a flow chart for implementing stage rotation.

FIG. 13 shows an example of a sample image.

FIG. 14 shows an example of a goal image.

FIG. 15 shows an example of a sample image after stage rotation.

FIG. 16 is a flow chart for implementing visual field movement and enlargement.

FIG. 17 shows an example of a sample image.

FIG. 18 shows an example of a goal image.

FIG. 19 shows an example of a sample image after performing visual field movement and enlargement.

DESCRIPTION OF EMBODIMENTS

Hereinafter, embodiments will be described with reference to the drawings. The embodiments described below do not limit the invention according to the claims, and all of combinations of features described in the embodiments are not necessarily essential to the solution to the problem.

First Embodiment

FIG. 1A shows a basic configuration diagram of a transmission electron microscopy (TEM) used in the present embodiment. An electron beam emitted from an electron source 801, which is an example of a charged particle source, is reduced by first and second capacitor lenses 802, and an emission angle is limited by a capacitor diaphragm 803. Further, the electron beam is emitted to a sample 814 in parallel by a magnetic field in front of an objective lens 808 after being subjected to axis adjustment by a misalignment correction deflector 804, a stigmator 805, and an image shift deflector 806.

The sample 814 is held on a sample stage 815. The sample 814 may be held by a sample holder fixed to the sample stage 815. The sample stage 815, the sample holder, or a combination thereof is an example of a movement mechanism that holds and moves the sample 814. Normally, in the TEM, due to the influence of a magnetic field behind the objective lens 808, a diffraction pattern is formed on a rear side focal surface located between the objective lens 808 and an intermediate lens 809, enlarged by the intermediate lens 809 and a projection lens 810, and detected by a CCD camera 812.

A computer 816 uses a plurality of control circuits to perform device control. The plurality of control circuits include an electron gun control circuit 901, an irradiation lens control circuit 902, a capacitor diaphragm control circuit 903, a misalignment correction deflector control circuit 904, a stigmator control circuit 905, an image shift deflector control circuit 906, an objective lens control circuit 907, an intermediate lens control circuit 909, a projection lens control circuit 910, a CCD camera control circuit 911, and a sample stage control circuit 912. The computer 816 creates any electro-optical condition by obtaining values of respective controlled units through the control circuits 901 to 912 and transmitting values of the respective controlled units through the control circuits 901 to 912.

FIG. 1B shows a configuration example of the computer 816. The computer 816 includes, for example, a processor 110, a memory 120, an auxiliary storage device 130, an input and output device 140, and a network interface 145. These components are connected to each other by a bus. The memory 120, the auxiliary storage device 130, or a combination thereof is a storage device.

The memory 120 is implemented by, for example, a semiconductor memory, and is mainly used for temporarily holding programs and data. The program stored in the memory 120 includes, for example, in addition to an operating system, a program for controlling each component of the transmission electron microscopy, a program for obtaining an image of the sample 814, and a program for processing the obtained image.

The processor 110 executes various processing according to the program stored in the memory 120. By operating the processor 110 according to the program, various functional units are implemented.

The auxiliary storage device 130 is implemented by a large-capacity storage device such as a hard disk drive or a solid state drive, and is used for holding the programs and data for a long period of time. The programs and data stored in the auxiliary storage device 130 are loaded into the memory 120 at startup or when needed, and the processor 110 executes the programs, and therefore, various processing of the computer 816 is executed. Therefore, the processing executed by the computer 816 in the following is also processing by the programs or the processor 110.

The input and output device 140 includes an input device and an output device (display device). The input device is a hardware device for a user to input instructions, information, or the like to the computer 816. The output device is a hardware device that displays various images for input and output.

The computer 816 implements a control system including one or more processors and one or more storage devices. The control system can include one or a plurality of computers. Some functions of the control system may be implemented by logic circuits. In the configuration example of FIG. 1A, the computer 816 and the control circuits 901 to 912 implement an example of a control unit of the transmission electron microscopy. Accordingly, the control unit can include a computer system (one or a plurality of computers) and one or a plurality of control circuits having a predetermined function.

Although FIG. 1A shows the configuration example of the TEM, the features of the present disclosure can be applied to other charged particle beam devices. For example, the features can be applied to a configuration of a scanning transmission electron microscopy (STEM). Unlike the TEM, the STEM irradiates the sample 814 with a converged electron beam, and scans the sample 814 with the converged electron beam using a deflection coil such as the image shift deflector 806. By using a transmission electron detector different from the CCD camera 812, a signal is recorded using the detector at each scanning position on the sample and an image can be displayed by the computer 816. The features of the present embodiment and other embodiments can also be applied to, for example, a scanning electron microscopy (SEM) for detecting secondary electrons and backscattered electrons, and a device using charged particles different from electrons.

The processing of the present embodiment will be described with reference to FIG. 2. In a first embodiment, when a target tilt angle (an example of a target arrangement state) is known, a procedure for moving to a target stage tilt angle using the method of the present embodiment is shown. In the present embodiment and other embodiments, a state of the sample 814 disposed on the sample stage 815 is referred to as the arrangement state. When the sample 814 is moved, the arrangement state thereof changes.

The sample stage 815 can be tilted on one or a plurality of tilt axes (rotation axes). In the following description, a flow of FIG. 2 shows that the sample stage is tilted to a target tilt angle on one tilt axis. The computer 816 can sequentially execute the flow on each of the tilt axes. The computer 816 may execute the flow of FIG. 2 on a plurality of tilt axis at the same time.

The flow starts at "start of adjustment" 101 and ends at "end of tilt movement of stage" 115. Hereinafter, the procedure of the first embodiment is shown according to the flow of FIG. 2. The flow is executed by the computer 816 using the control circuits 901 to 912. Here, an operation of changing a tilt angle of the sample stage 815 (tilt operation) is included in the movement of the sample stage 815. The movement of the sample stage 815 includes tilt movement, shift movement, rotation movement, or the like.

After the "start of adjustment" 101, the computer 816 performs "obtain tilted image series" 102 of the sample in order to derive a set angle (horizontal angle) of the sample stage 815 at which the sample 814 is parallel to an imaging surface (detection surface) of the CCD camera 812. The computer 816 controls the sample stage 815 via the sample stage control circuit 912 to change a tilt angle of the sample 814. In the "obtain tilted image series" 102, for example, the tilt angle is varied in a constant direction (for example, clockwise or counterclockwise) on the tilt axis. The constant direction of the tilt movement reduces effects of backlash on the sample stage 815.

For example, in order to obtain an image at each tilt angle (tilted image), the computer 816 controls the sample stage 815 such that positions of sample images in a visual field before and after the tilt movement are substantially the same. For example, the computer 816 translates the sample stage 815 based on correlation values of the images before and after the tilt movement.

FIG. 3 shows an example of obtaining the tilted image series. FIG. 3 is an example of a sample for a transmission electron microscopy in which a pattern on a wafer is prepared by a focused ion beam (FIB) device in a semiconductor manufacturing process. As the tilted image series 150, FIG. 3 shows apart of the image obtained by tilting the sample stage 815 at a tilt angle from −11 degrees to +13 degrees with the tilt axis 155 as a center. The tilt angle is a set angle set by the computer 816 and does not necessarily match an actual tilt angle of the sample stage 815.

In a series of images, an image 151 is an image at −11 degrees and an image 152 is an image at +13 degrees. A group of images between the image 151 and the image 152 is an example of an intermediate image at different tilt angles greater than −11 degrees and less than +13 degrees. An axis 156 is an axis perpendicular to the tilt axis 155 on which a feature amount described later is calculated.

An example of "calculate angle at which sample is horizontal" 103 in FIG. 2 is shown in FIG. 4. A graph 201 obtained by extracting the feature amount as shown in FIG. 4 is a result of measuring a length along the axis 156 perpendicular to the tilt axis 155 (horizontal axis of each image in FIG. 3) from the group of images shown in FIG. 3 as the feature amount. The length along the axis 156 is measured at the same position in the image. In one example, a length of the longest part of the image 151 is measured. Accordingly, the horizontal angle can be determined more accurately.

In the graph 201, the horizontal axis represents the tilt angle and a vertical axis represents the feature amount. From the graph 201, it can be seen that the feature amount increases or decreases depending on the tilt angle. The horizontal angle is a tilt angle at which the feature amount is maximized. As one of the methods for obtaining the tilt angle at which the feature amount is maximized, FIG. 5 shows a result of assuming and fitting a cos distribution with respect to the feature amount in the graph 301.

FIG. 5 shows a fitting graph 251 of the feature amount. The result of assuming and fitting the cos distribution is shown by a line 253. In this case, a maximum value of the fitted cos distribution is a tilt angle of 0.84 degrees shown by a wavy line 252 in the graph 251. For example, the angle (set tilt angle) is the result calculated as the horizontal angle of the sample 814.

"Determination of fitting result" 104 determines whether the fitting is appropriate. When an error is less than or equal to a permissible value, the fitting is determined to be appropriate. In a method of determining the error, it is conceivable that, for example, a value when an error amount between a line 403 which is the fitting result and a measured value of the feature amount is averaged at each tilt angle is less than 1 pixel.

The horizontal angle of an "appearance" of the sample is calculated by the procedure from the "start of adjustment" 101 to the "determination of fitting result" 104 in FIG. 2. In the sample prepared by the focused ion beam device, an angle of the "appearance" and an internal crystal orientation do not always match. The computer 816 tilts the sample 814 to the target tilt angle required for internal observation of the sample 814 in "set target tilt angle" 105. The target tilt angle may be determined from the diffraction pattern of the sample before the start of adjustment, or may be calculated by a method in the related art in a process of calculating a horizontal angle. In the present embodiment, the target tilt angle is A degree.

"Calculation of goal image of target tilt angle using Homography transformation" 106 in FIG. 2 calculates a goal image based on a difference between a target tilt angle A (target arrangement state) and a tilt angle in the reference arrangement state with the obtained horizontal angle (0.84 degrees) as a reference. The calculation of the goal image uses the reference image of the sample in the reference arrangement state. The reference image is, for example, an image in an arrangement state in which the tilt angle is closest to the target tilt angle A in the tilted image series 150 of FIG. 3. In the calculation of the goal image, Homography transformation is generally performed using the reference image. The computer 816 may select an arrangement state of a tilt angle away from the target tilt angle A as the reference arrangement state. FIG. 6 shows an example of a goal image 301.

In "tilt movement of stage" 107 in FIG. 2, the computer 816 tilts the sample stage 815 toward the target tilt angle A. With the tilt movement of the sample stage 815, a height of the sample stage 815 may change and a visual field escape of the sample 814 may occur.

The computer 816 performs "imaging" 108 after moving the sample stage 815 to a specific tilt angle near the target tilt angle A such that the sample 814 does not escape from the visual field. The computer 816 performs "focus adjustment" 109 if the captured image is out of focus in "focus determination" 110.

When it can be determined that a focus value is appropriate, the computer 816 performs "calculate correlation value between sample image and goal image" 112. The sample image is a candidate image, and the correlation value represents a comparison result thereof. The correlation value can be calculated by any algorithm (correlation function), and is represented by, for example, a sum of absolute values of brightness differences of pixels. In the calculation of the correlation value, a deviation amount between the visual field of the captured sample image and the visual field of the goal image can be calculated. When the deviation amount is larger than a threshold value, the computer 816 adjusts the position of the sample stage 815 and re-images the sample image.

The computer 816 determines the number of times a correlation value is measured between the goal image and an image captured at a different tilt angle in "are correlation values obtained at a plurality of angles" 113. The correlation value is calculated more than once. For example, in consideration of the backlash, the computer 816 obtains a correlation value between the candidate image and the goal image in different arrangement states within a range of about ±1 degree with respect to the target tilt angle A with a step width according to required accuracy. When the correlation value is not calculated with a sufficient angle width, such as when it is difficult to determine the maximum value of the correlation value, the computer 816 moves the sample stage 815 to the next tilt angle in "tilt angle adjustment" 111.

The user can confirm this operation on a screen of the input and output device 140 of the computer 816. FIG. 7 shows an example of a GUI screen 351 on a computer screen. The GUI screen 351 describes a case where the tilt axis is two axes. On the GUI screen 351, a goal image 352 is displayed in the upper left, and stage information 354 at a target tilt angle is displayed in the lower left. A sample image 353 at a current stage position is displayed in the upper center of the GUI screen 351 and current stage information 355 is displayed in the lower center.

In order to see the change of the correlation value calculated a plurality of times, a graph 356 showing the change of the correlation value according to the tilt angle is displayed on the right side of the GUI screen 351. A graph of the change in the correlation value 356 displays the change in the correlation value for two tilt axes (ALPHA axis and BETA axis) assuming a two-axis tilt. This display method is an example, and there is also a method in which the graph of the change in the correlation value 356 uses a three-dimensional display graph 401 as shown in FIG. 8.

In "is correlation value maximum at current angle?" 114 in FIG. 2, the user may make a determination by looking at the change in the correlation value 356 in the GUI screen 351, and the computer 816 may automatically determine the maximum value based on a result of calculating the correlation value a plurality of times. When the correlation value is the maximum at the current angle, a current candidate arrangement state is closest to the target arrangement state, and the movement of the sample stage 815 is completed.

As described above, in the present embodiment, the goal image to be the image after movement is created by computer processing using a sample image obtained by a charged particle beam application device. By comparing the goal image with the captured sample image and feeding back the obtained information to the user, it is possible to move the sample with high accuracy and observe the sample with high throughput. Alternatively, by feeding back the obtained information to control parameters in the electron microscopy, it is possible to automatically move the sample with high accuracy and observe the sample with high throughput.

Second Embodiment

In the configuration of the first embodiment, the GUI screen 351 may be omitted. If there is no GUI screen 351, a series of images at tilt angles are stored in a folder in the computer 816. The goal image is compared with the captured image, and a data file that describes the change in the correlation value is also stored. After all the processing is completed, the user can confirm the change in the correlation value of each image of the stage movement or the corresponding image, and can confirm the completion of the stage movement.

In a second embodiment, a series of images at tilt angles may not be stored, and only the change in the correlation value may be stored in the computer 816. This method is, for example, a method taken when the image is sensitive information. Alternatively, not only the series of images at the tilt angles, the change in the correlation value may not be stored either. In this case, the stored data is log data of whether the stage movement is completed normally. Particularly, when the stage movement is not completed normally, since the cause is stored as the log data in the computer, the user can investigate the reason why the stage movement is not completed normally.

Third Embodiment

In the first embodiment, the stage movement is completed when the correlation value between the goal image and the image of the current tilt angle became maximum, but when the tilt angle is small, the change in the correlation value is also small, and estimation accuracy of the tilt angle may deteriorate. A method for improving accuracy in such a situation will be described in a third embodiment. In the third embodiment, the accuracy is improved by enlarging the sample image and moving an observation region by an image shift performed by deflecting an electron probe.

FIG. 9 shows a sample image 451 with a low magnification and wide visual field in the third embodiment. In the third embodiment, since the feature amount of the image is measured by using the image shift, it is necessary that a target sample structure is within a range where the image shift can be shaken. A maximum shift amount of the image shift is generally several μm. In the third embodiment, an enlarged image is obtained at two positions of a visual field (1) 452 and a visual field (2) 453. A distance 454 in an X direction between the two visual fields is represented by X_ISF, and a distance 455 in a Y direction is represented by Y_ISF.

FIG. 10 shows a sample image obtained in each visual field. It is assumed that the sample image is obtained at a tilt angle B. The tilt angle B is a reference arrangement state, and a sample image 501 of the visual field (1) 452 and a sample image 502 of the visual field (2) 453 are reference images of the visual field (1) 452 and the visual field (2) 453, respectively. The computer 816 creates a goal image at the target tilt angle A (target arrangement state) with respect to each of the sample image 501 of the visual field (1) 452 and the sample image 502 of the visual field (2) 453 in FIG. 9.

As in the first embodiment, the computer 816 uses the Homography transformation to calculate each goal image from the sample image 501 of the visual field (1) 452 and the sample image 502 of the visual field (2) 453 based on a difference between the tilt angle B at which the sample image is obtained and the target tilt angle A. The computer 816 further transforms the distances X_ISF and Y_ISF in the X and Y directions. The goal images of the visual field (1) and the visual field (2) at the target tilt angle A and a positional relationship thereof can be obtained. The visual field (1) and the visual field (2) are separated by the image shift. For example, in the image in the visual field (1) as a reference, the image contracts or enlarges by a rotation angle, while the image in the visual field (2) not only contracts or enlarges, the entire image also moves closer to or further away in a direction of the visual field (1).

FIG. 11A shows a goal image 521 of the visual field (1) and a goal image 522 of the visual field (2) created by using the computer 816. The computer 816 compares the sample images (candidate images) of the visual field (1) and the visual field (2) captured by the electron microscopy with the corresponding goal images, respectively, and calculates a shift amount of the two candidate images in each visual field from the correlation value obtained by the correlation function. The shift amount is generally calculated as the number of movement pixels when the correlation value is maximized, but may be calculated as a change in the feature amount by image matching or the like.

The shift amount between the goal image and the sample image with respect to the visual field (1) is set to (X1, Y1), and the shift amount between the goal image and the sample image with respect to the visual field (2) is set to (X2, Y2). The shift amount is represented by a positive or negative value depending on a direction. The tilt angle (candidate arrangement state), at which an absolute value of a difference (X1−X2) and/or (Y1−Y2) of each shift amount in the X and Y directions obtained at a plurality of tilt angles is minimized, is closest to the tilt angle (target arrangement state) of the goal image. These values represent a comparison result of a goal image pair and a candidate image pair.

For example, when the sample stage 815 is tilted on only one tilt axis along the X direction, the tilt angle, at which the absolute value of the shift amount in the Y direction is minimized, is closest to the tilt angle of the goal image. When the sample stage 815 is tilted on both the tilt axis along the X direction and the tilt axis along the Y direction, the tilt angle, at which the absolute value of the difference between the shift amounts in the X and Y directions is minimized, is closest to the tilt angle of the goal image.

The computer 816 uses the above result to implement the tilt movement of the sample stage 815. FIG. 11B shows a sample image 531 of the visual field (1) and a sample image 532 of the visual field (2) after the tilt movement. As described above, the third embodiment compares a positional relationship of the goal images with a positional relationship of the candidate images in the two visual fields. In the third embodiment, stage movement control using a performance of the electron microscopy is possible by using the enlargement of the sample image and the image shift.

Fourth Embodiment

According to the features of the present disclosure, the computer 816 can search for an imaging condition of an image created by arithmetic processing by the computer 816. In a forth embodiment, the features of the present disclosure are applied to the rotation of a sample. For example, in observation using the transmission electron microscopy (TEM) that obtains an enlarged image without scanning the sample with an electron beam, the sample is rotated by the sample stage 815 or a rotation mechanism disposed in a holder disposed in the sample stage 815.

Generally, a center of rotation of the sample stage 815 (holder) and a center of the sample are different, and therefore, a sample position in a visual field moves significantly with the rotation. Normally, when rotating the sample, an observation condition is set to a low magnification, and movement of the sample in the visual field with the rotation is sequentially returned by the stage movement. By applying the features of the present disclosure to the rotation of the sample, such a process can be implemented automatically with high accuracy.

FIG. 12 shows a flow of the forth embodiment in which the features of the present disclosure are applied to the rotation of the sample. In FIG. 12, the flow starts from "start of adjustment" 551 and ends in end of rotation movement of stage 563. In the following, it is assumed that the sample stage 815 rotates. In "obtain sample image" 552, the computer 816 obtains a sample image 601 before rotation movement as shown in FIG. 13. The sample image 601 is a reference image in the reference arrangement state. A rotation angle (rotation angle to the target arrangement state) of the target sample 814 (sample stage 815) is specified in "set target rotation angle and step angle" 553.

The target rotation angle is generally specified by a method of inputting a number on a GUI by the user, but the computer 816 may determine an orientation of the sample from, for example, a diffraction pattern or a sample image, and automatically determine the orientation. The step angle is determined by the computer 816 from a preset specified value or a target rotation angle.

FIG. 14 shows a goal image 651 calculated from the reference image 601 by the computer 816 in "calculation of goal image after step angle rotation" 554 in FIG. 12. The goal image 651 uses Affine transformation for image rotation processing, but may be generated by any transformation as long as the transformation processing can perform image rotation. In "rotation movement of stage" 555, the computer 816 rotates the sample 814 (the sample stage 815) toward a target rotation angle specified on the GUI.

The computer 816 may rotate the sample 814 by the target rotation angle at one time, but since the sample generally escapes from the visual field, the sample is rotated and moved in sufficiently fine steps such that the sample does not escape from the visual field toward a target angle. In this case, the goal image is created for each step angle and compared with the sample image.

In "imaging" 556, the computer 816 obtains a sample image after the rotation movement of the stage is completed. FIG. 15 shows a sample image 701 after rotation movement. In "visual field determination" 557, the computer 816 confirms that a sample to be observed is in the visual field. When the step angle is rough, the sample may not be in the visual field in the "visual field determination" 557. If the sample disappears from the visual field, the rotation movement cannot be adjusted, and therefore, the computer 816 determines that the step angle is large, moves to an angle before the rotation movement by "return stage angle to one before rotation" 566, and executes "change of step angle" 558.

When there is a sample in the visual field, the computer 816 executes "focus determination" 564. Depending on a rotation mechanism of the sample 814 and a form of holding the sample, a height of the sample may change as the sample rotates, and the sample image may be blurred. When the focus deviates from an appropriate value, the computer 816 executes "focus adjustment" 565.

When the focus value is appropriate, the computer 816 calculates a correlation value between the goal image 651 and the sample image 701 after rotation in "calculate correlation value between sample image and goal image" 559. At this time, a visual field deviation amount can also be calculated by calculating the correlation value between the sample image 701 after rotation and the goal image 651. When a sample position corresponding to the goal image has moved significantly from a visual field size, the computer 816 executes "adjustment of stage position" 567 to move the sample image to a position in the same visual field as the goal image.

In "is current angle target angle" 568, the computer 816 determines that the sample 814 has moved to the target rotation angle. The computer 816 determines "is correlation value obtained at a plurality of angles near target rotation angle" 560. The computer 816 calculates the correlation value at a plurality of rotation angles particularly near the target angle. Images at different rotation angles (different arrangement states) are candidate images. In this case, if necessary, the computer 816 finely re-rolls the step angle to improve the accuracy of rotation movement. This is because even if the sample stage 815 or the holder is rotationally moved to the target rotation angle, the angle does not completely match the target angle due to limited backlash existing in the rotation mechanism.

The computer 816 performs "rotation angle adjustment" 561 according to target accuracy and obtains the correlation value of the plurality of rotation angles. After obtaining the correlation values of the plurality of rotation angles, the computer 816 determines "is correlation value maximum at current angle" 562. As shown in the first embodiment, the determination method may be performed by the user on the screen of the GUI, or the computer 816 may automatically determine the maximum value. A candidate arrangement state in which the correlation value is the highest is closest to the target arrangement state. After confirming that the correlation value has reached the maximum, "end of rotation movement of stage" 563 is performed.

Fifth Embodiment

According to the features of the present disclosure, the computer 816 can search for an imaging condition of an image created by arithmetic processing by the computer 816. A fifth embodiment applies the features of the present disclosure to magnification adjustment and visual field shift in sample observation. By applying the features of the present disclosure to the sample observation, a highly accurate and high-speed sample observation environment can be implemented. FIG. 16 shows a flow of the fifth embodiment in which the features of the present disclosure are applied to the magnification adjustment and the visual field shift of the sample observation.

In FIG. 16, the flow starts from "start of adjustment" 721 and ends in "end of visual field position shift" 736. In "obtain sample image" 722, the computer 816 obtains a low-magnification sample image 751 (reference image) as shown in FIG. 17. In "set detailed observation region" 723 of FIG. 16, the computer 816 specifies a region indicated by a square 752 in the sample image 751. Normally, the square 752 is specified by selecting a region that the user wants to observe on a GUI, but the computer 816 may specify the region as long as the square 752 is always at the same position. The computer 816 performs "calculate enlargement magnification and visual field shift amount" 724 from a relationship between a size of the region selected by the square 752 and a visual field range and magnification of the sample image 751.

The square 752 in FIG. 17 does not necessarily have the same aspect ratio as the low-magnification sample image 751 when specified by the user. Therefore, in the calculation of the enlargement magnification in the "calculate enlargement magnification and visual field shift amount" 724, the required magnification for both vertical (hereinafter referred to as a Y direction 753) and horizontal (hereinafter referred to as an X direction 754) is calculated. For the calculation of the magnification, vertical (hereinafter, a Y1 length 755) and horizontal (hereinafter, an X1 length 756) of the square 752 are used. When the observation magnification is 1500 times, enlargement magnification MY required in the Y direction 753 of the square 752 and enlargement magnification MX required in the X direction 754 are obtained by the following equations.

$$MY=1500 \times Y/Y1, MX=1500 \times X/X1$$

In order to set the entire region of the square 752 to be observable after enlargement, the computer 816 selects a smaller one of MY and MX as the magnification (hereinafter referred to as M). Visual field shift amounts are distances in the X and Y directions between image center coordinates (XC1, YC1) of the low-magnification sample image 751 in FIG. 17 and center coordinates (XC2, YC2) of the square 752. A distance LX in the X direction and a distance LY in the Y direction are calculated by the following equations.

$$LY=YC2-YC1, LX=XC2-XC1$$

In "calculation of goal image of target position" 725 in FIG. 16, the computer 816 calculates the goal image. FIG. 18 shows a goal image 771 calculated from the square 752 in the reference image 751 of FIG. 17. In this case, the goal image is an enlarged image obtained by cropping the low-magnification sample image 751. In "magnification change" 726 in FIG. 16, the computer 816 changes the observation magnification to M. In "visual field shift" 727, the computer 816 shifts LX in the X direction and LY in the Y direction using the sample stage 815 or the image shift, and therefore, an image near the region specified by the square 752 in FIG. 17 can be obtained. Since there is backlash in the stage movement, the visual field does not always match the specified region, and highly accurate stage position adjustment is required according to the subsequent flow.

In "imaging" 728 in FIG. 16, the computer 816 images a sample image. The computer 816 executes "focus determination" 729 on the captured sample image. When the focus is not appropriate and the sample image is blurred, the computer 816 executes "focus adjustment" 732. If the focus is appropriate, the computer 816 executes "correlation value determination" 733. There are several possible methods for determining the correlation value, and for example, the shift amount of the image, in which the correlation value between the goal image and the sample image is the maximum value, is calculated. If the shift amount is less than 1 pixel, it may be determined that the correlation is sufficiently high.

When the shift amount of the image is large in the "correlation value determination" 733, the computer 816 executes "finely move visual field based on shift amount" 731. Images captured in each of arrangement states of different shift amounts are candidate images. If it is determined that the shift amount is less than 1 pixel and the correlation is sufficiently high, the candidate arrangement state is closest to the target arrangement state, and the computer 816 ends the flow in "end of visual field movement" 736. At this time, if the shift amount equal to or less than the stage movement accuracy is calculated, the image shift may be used for the fine movement of the sample.

The invention is not limited to the above embodiments, and includes various modifications. For example, the embodiments described above are described in detail for easy understanding of the invention, and the invention is not necessarily limited to those including all the configurations described above. Further, a part of the configuration of one embodiment can be replaced with the configuration of another embodiment, and the configuration of another embodiment can be added to the configuration of one embodiment. Further, a part of the configuration of one embodiment may be added, deleted, or replaced with another configuration.

Each of the configurations, functions, processing units, or the like described above may be partially or entirely implemented by hardware such as through design using an integrated circuit. The above-described configurations, functions, or the like may also be implemented by software by means of interpreting and performing a program, by a processor, for implementing respective functions. Information of programs, tables, files or the like for implementing each function can be placed in a recording device such as a memory, a hard disk, and a solid state drive (SSD), or a recording medium such as an IC card, an SD card.

Further, control lines and information lines are those that are considered necessary for the description, and not all the control lines and the information lines on the product are necessarily shown. In practice, it may be considered that almost all the configurations are connected to each other.

The invention claimed is:

1. A charged particle beam device, comprising:
   a sample stage configured to hold and move a sample;
   a charged particle source configured to emit charged particles with which the sample is irradiated to obtain an image of the sample; and
   a computer configured to control the sample stage using a sample stage control circuit to move the sample and to obtain the image of the sample, wherein
   the computer is configured to
   obtain a reference image of the sample in a reference arrangement state by the charged particles,
   generate a goal image of the sample in a target arrangement state different from the reference arrangement state by calculation from the reference image,
   move the sample to each of a plurality of different arrangement states by moving the sample stage using the sample stage control circuit, and obtain a candidate image of the sample in each of the plurality of different arrangement states by the charged particles, and
   generate a comparison result between respective candidate images and the goal image.

2. The charged particle beam device according to claim 1, wherein
   the computer is further configured to move the sample based on the comparison result.

3. The charged particle beam device according to claim 1, wherein
   the movement of the sample includes tilt movement of the sample.

4. The charged particle beam device according to claim 3, wherein
   the computer is further configured to
   tilt and move the sample in a certain direction by moving the sample stage using the sample stage control circuit, and obtain tilted images at different tilt angles,
   select a tilted image at a reference tilt angle from the tilted images as the reference image based on a feature amount of the tilted image, and
   generate the goal image from the reference image based on a difference between a tilt angle in the target arrangement state and the reference tilt angle.

5. The charged particle beam device according to claim 3, wherein
   the computer is further configured to
   obtain, by image shift, a first reference image and a second reference image of the sample by the charged particles in a first region and a second region which are different from each other,
   generate a first goal image and a second goal image of the first region and the second region in the target arrangement state by calculation from the first reference image and the second reference image, and identify a positional relationship between the first goal image and the second goal image,
   obtain, by image shift, a first candidate image and a second candidate image by the charged particles in the first region and the second region in each of the plurality of different arrangement states, and obtain a positional relationship between the first candidate image and the second candidate image, and
   generate a comparison result between the positional relationship between the first goal image and the second goal image, and the positional relationship between each pair of the first candidate image and the second candidate image.

6. The charged particle beam device according to claim 1, wherein
   the movement of the sample includes rotation movement of the sample.

7. The charged particle beam device according to claim 6, wherein
   the target arrangement state is an arrangement state obtained by rotation by a predetermined angle from the reference arrangement state,
   the computer is configured to control the sample stage using the sample stage control circuit to rotate the sample, and
   a plurality of different arrangement states have different rotation angles respectively.

8. The charged particle beam device according to claim 1, wherein
   the movement of the sample includes shift movement of the sample.

9. The charged particle beam device according to claim 8, wherein
   the goal image is a partially enlarged image of the reference image,
   the computer is further configured to control the sample stage using a sample stage control circuit to shift the sample, and
   the plurality of different arrangement states have different shift amounts respectively.

10. The charged particle beam device according to claim 1, wherein
   the computer is further configured to calculate a correlation value between the respective candidate images and the goal image as the comparison result.

11. The charged particle beam device according to claim 1, wherein
the computer is further configured to output the comparison result in an output device.

12. The charged particle beam device according to claim 1, wherein
the computer is further configured to determine an arrangement state closest to the target arrangement state in the plurality of different arrangement states based on the comparison result.

13. A control method of a charged particle beam device, comprising:
obtaining a reference image of a sample in a reference arrangement state by irradiating the sample on a moveable sample stage using a charged particle source configured to emit charged particles;
generating a goal image of the sample in a target arrangement state different from the reference arrangement state by calculation from the reference image;
moving the sample to each of a plurality of different arrangement states by moving the sample stage, and obtaining a candidate image of the sample in each of the plurality of different arrangement states by the charged particles; and
generating a comparison result between respective candidate images and the goal image.

14. The control method according to claim 13, further comprising:
moving the sample based on the comparison result.

15. The control method according to claim 13, further comprising:
obtaining, by image shift, candidate images of the sample by the charged particles at different positions before generating the comparison result.

* * * * *